US010393796B2

(12) United States Patent
Pileggi et al.

(10) Patent No.: US 10,393,796 B2
(45) Date of Patent: Aug. 27, 2019

(54) TESTING INTEGRATED CIRCUITS DURING SPLIT FABRICATION

(71) Applicant: CARNEGIE MELLON UNIVERSITY, Pittsburgh, PA (US)

(72) Inventors: Lawrence Pileggi, Pittsburgh, PA (US); Bishnu P. Das, Pittsburgh, PA (US); Kaushik Vaidyanathan, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 413 days.

(21) Appl. No.: 15/112,369

(22) PCT Filed: Jan. 21, 2015

(86) PCT No.: PCT/US2015/012220
§ 371 (c)(1),
(2) Date: Jul. 18, 2016

(87) PCT Pub. No.: WO2015/160405
PCT Pub. Date: Oct. 22, 2015

(65) Prior Publication Data
US 2016/0341786 A1     Nov. 24, 2016

Related U.S. Application Data

(60) Provisional application No. 61/965,077, filed on Jan. 22, 2014.

(51) Int. Cl.
*G01R 19/257* (2006.01)
*G01R 31/28* (2006.01)

(52) U.S. Cl.
CPC .............. *G01R 31/2818* (2013.01)

(58) Field of Classification Search
CPC ............ G01R 31/2818; G01R 324/537; G01R 700/121; G01R 31/2851; G01R 31/2856;
(Continued)

(56) References Cited

U.S. PATENT DOCUMENTS 5,059,899 A    10/1991   Farnworth et al.
7,195,931 B2    3/2007   Jarvis et al.
(Continued)

FOREIGN PATENT DOCUMENTS

WO    WO2015160405      10/2015

OTHER PUBLICATIONS

Heck, S. et al., "Creating value in the semiconductor industry," McKinsey & Company, Autumn 2011.
(Continued)

*Primary Examiner* — Melissa J Koval
*Assistant Examiner* — Courtney G McDonnough
(74) *Attorney, Agent, or Firm* — Fish & Richardson P.C.

(57) ABSTRACT

In one aspect, a method comprises providing at least two identical front-end-of-line (FEOL) portions of an integrated circuit (IC) in a single wafer, with at least some of each FEOL portion comprising a plurality of circuit elements; building a design back-end-of-line (BEOL) portion of the IC on at least one of the FEOL portions to form a product chip, with the design BEOL portion configuring design-type interconnections of the same plurality of circuit elements for a first instantiation; building a test-only BEOL structure on at least one of the FEOL portions to form a sacrificial test device, with the test-only BEOL structure configuring test-type interconections of the same plurality of circuit elements for a second instantiation; and testing the sacrificial test device for at least one of functionality or reliability.

20 Claims, 6 Drawing Sheets

(58) Field of Classification Search
CPC .. G01R 31/303; G01R 31/307; G01R 31/311; H01L 22/30; H01L 22/32; H01L 22/34
See application file for complete search history.

(56) References Cited

U.S. PATENT DOCUMENTS

| | | | |
|---|---|---|---|
| 7,346,922 | B2 | 3/2008 | Warren et al. |
| 7,724,016 | B2 | 5/2010 | Yuan et al. |
| 2004/0102019 | A1* | 5/2004 | Jarvis ............... H01L 22/20 438/455 |
| 2009/0121737 | A1* | 5/2009 | Yuan ................. G01R 31/2882 324/754.23 |

OTHER PUBLICATIONS

Potkonjak, M. et al., "Hardware Trojan horse detection using gate-level characterization," DAC, Jul. 2009.
Skorobogatov, S. et al., "Breakthrough Silicon Scanning Discovers Backdoor in Military Chip," CHES, Sep. 2012.
Shiyanovskii, Y. et al., "Process reliability based trojans through NBTI and HCI effects," NASA/ESA, Jun. 2010.
Becker, G. et al., "Stealthy dopant-level hardware trojans," CHES, Sep. 2012.
Rajendran, J. et al., "Design and analysis of ring oscillator based Design-for-Trust technique," VTS, May 2011.
Jhaveri, T. et al., "Maximization of layout printability/manufacturability by extreme layout regularity," Proc. SPIE 6156, Mar. 2009.
Rajendran, J. et al., "Is split manufacturing secure?," DATE, Mar. 2013.
Waksman, A. et al., "Tamper Evident Microprocessors," Symposium on Security and Privacy, May 2010.
Vattikonda, V. et al., "Modeling and minimization of PMOS NBTI effect for robust nanometer design," DAC, Jul. 2006.
Walker, J. et al., "Conceptual Foundations of the Ivy Bridge Random Number Generator," Presentation at ISTS Colloquium at Dartmouth College, Nov. 2012.
Williams, T. et al., "The interdependence between delay-optimization of synthesized networks and testing," DAC, Jun. 1991.
International Search Report and Written Opinion dated Sep. 30, 2015 for Int'l. Appln. No. PCT/US15/12220 (14 pgs.).

* cited by examiner

TESTING INTEGRATED CIRCUITS DURING SPLIT FABRICATION

CROSS-REFERENCE TO RELATED APPLICATIONS

This application is a § 371 National Stage Application of PTC/US2015/012220,filed Jan. 21, 2015, which, in turn, claims the benefit of priority under 35 U.S.C. § 119(e) to provisional U.S. Patent Application No. 61/965,077, filed on Jan. 22, 2014, the entire contents of which are hereby incorporated by reference.

STATEMENT REGARDING FEDERALLY SPONSORED RESEARCH AND DEVELOPMENT

This invention is made with partial government support under Intelligence Advanced Research Projects Activity (IARPA) Trusted Integrated Chips (TIC) Program grant number NC6600112C2008-NAVY. The government has certain rights to this invention.

FIELD OF USE

The present disclosure relates generally to integrated circuits (ICs).

BACKGROUND

Integrated circuit (IC) fabrication can include a front-end-of-line (FEOL) process and a back-end-of-line (BEOL) process. The FEOL process is the first portion of IC fabrication where the individual devices, such as transistors, capacitors, and resistors, are patterned in the semiconductor. The FEOL process results in a wafer with isolated devices. Once the various devices have been created, the devices can be interconnected to form the desired electrical circuit. This occurs in a series of wafer processing steps referred to as BEOL process. The BEOL process is the second portion of IC fabrication where the individual devices get interconnected with wiring on the wafer. The BEOL process generally begins when the first layer of metal is deposited on the wafer. The BEOL process can include creating contacts, insulating layers, metal layers, and bonding sites for chip-to-package connections.

After the FEOL process has been completed, the individual devices may be subjected to a variety of tests to determine if the devices will function properly and reliably. ICs may be designed with testability features such as scan chains or built-in self-tests (BIST). Even with these testability features implemented in the IC, it may be difficult to exhaustively test each individual device of the FEOL portion of the IC for manufacturing defects and process variations.

SUMMARY

The present disclosure describes apparatus and methods relating to testing the characteristics and behavior of the FEOL portion of an IC. In one aspect of the disclosure, a method comprises providing at least two identical front-end-of-line (FEOL) portions of an integrated circuit (IC) in a single wafer, with at least some of each FEOL portion comprising a plurality of circuit elements; building a design back-end-of-line (BEOL) portion of the IC on at least one of the FEOL portions to form a product chip, with the design BEOL portion configuring design-type interconnections of the same plurality of circuit elements for a first instantiation; building a test-only BEOL structure on at least one of the FEOL portions to form a sacrificial test device, with the test-only BEOL structure configuring test-type interconnections of the same plurality of circuit elements for a second instantiation; and testing the sacrificial test device for at least one of functionality or reliability.

Implementations of the disclosure can include one or more of the following features. Building the test-only BEOL structure on the FEOL portion may include building the test-only BEOL structure on the FEOL portion using a split fabrication process. The method may include, after completion of the manufacturing of the FEOL portion of the IC, generating a test-only BEOL design using a set of values for control parameters, where the set of values is selected from a plurality of sets of values for the control parameters, with each of the plurality of sets of values generating a different test-only BEOL design for the FEOL portion, wherein building the test-only BEOL structure on the FEOL portion may include building the test-only BEOL structure on a randomly selected sacrificial die of the wafer containing the FEOL portion using the generated test-only BEOL design. The plurality of circuit elements may include a plurality of logic gates, and testing the sacrificial test device may include testing the sacrificial test device for at-speed function of every logic gate of the plurality of logic gates. The test-only BEOL structure may configure the test-type interconnections of the same plurality of logic gates so that all of the plurality of logic gates are part of at least one path that is within 5% of a longest path delay of the IC. The test-only BEOL structure may configure the test-type interconnections of the same plurality of logic gates so that a number of paths is proportional to a number of the plurality of logic gates as a function of the logic depth. The test-only BEOL structure may configure the test-type interconnections of the same plurality of logic gates so that each of the plurality of logic gates is driven by one time varying input. The plurality of circuit elements may include a plurality of logic gates, and the test-only BEOL structure may configure the same plurality of logic gates as one or more ring oscillators (ROs). Two or more of the ROs may have a same delay. The plurality of circuit elements may include a plurality of flip-flops, and the test-only BEOL structure may configure the plurality of flip-flops as frequency dividers or counters.

In another aspect of the disclosure, a device comprises at least two identical front-end-of-line (FEOL) portions of an integrated circuit (IC) in a single wafer, with each of the FEOL portions comprising a plurality of circuit elements; a design back-end-of-line (BEOL) portion of the IC built on at least one of the FEOL portions to form a product chip, with the design BEOL portion configuring design-type interconnections of the same plurality of circuit elements for a first instantiation; and a test-only BEOL structure built on at least one of the FEOL portions to form a sacrificial test device, with the test-only BEOL structure configuring test-type interconnections of the same plurality of circuit elements for a second instantiation to allow testing of the sacrificial test device for at least one of functionality or reliability.

Implementations of the disclosure can include one or more of the following features. The test-only BEOL structure may be built on the FEOL portion using a split fabrication process. The test-only BEOL structure may be built on a randomly selected sacrificial die of the wafer containing the FEOL portion according to a test-only BEOL design, with the test-only BEOL design generated after completion of the manufacturing of the FEOL portion of the IC using a set of values for control parameters, where the set of values is selected from a plurality of sets of values for the control parameters, with each of the plurality of sets of values generating a different test-only BEOL design for the FEOL portion. The plurality of circuit elements may include a plurality of logic gates, and the test-only BEOL structure may allow testing of the device for at-speed function of every logic gate of the plurality of logic gates. The test-only BEOL structure may configure the test-type interconnections of the same plurality of logic gates so that all of the plurality of logic gates are part of at least one path that is within 5% of a longest path delay of the IC. The test-only BEOL structure may configure the test-type interconnections of the same plurality of logic gates so that a number of paths is proportional to a number of the plurality of logic gates as a function of the logic depth. The test-only BEOL structure may configure the test-type interconnections of the same plurality of logic gates so that each of the plurality of logic gates is driven by one time varying input. The plurality of circuit elements may include a plurality of logic gates, and the test-only BEOL structure may configure the same plurality of logic gates as one or more ring oscillators (ROs). Two or more of the ROs may have a same delay. The plurality of circuit elements may include a plurality of flip-flops, and the test-only BEOL structure may configure the plurality of flip-flops as frequency dividers or counters.

The details of one or more implementations are set forth in the accompanying drawings and the description below. Other features, objects, and advantages will be apparent from the description, the drawings, and the claims.

DETAILED DESCRIPTION

With escalating costs and complexity of semiconductor manufacturing, some companies may outsource the manufacturing of their ICs to off-shore manufacturing facilities. Mission critical ICs for defense and infrastructure may require a trusted and cutting edge semiconductor manufacturing process, which can be achieved through a technique called split fabrication. Split fabrication can include splitting the manufacturing of an IC into two tiers. The two tiers may include manufacturing of different portions of the IC by a single facility using different processes or manufacturing of different portions of the IC by two different facilities.

For example, the two tiers may include an untrusted tier and a trusted tier. The untrusted tier can include manufacturing of a portion of the IC at an advanced off-shore facility, and the trusted tier can include manufacturing of another portion of the IC at a secure on-shore facility. As the manufacturing of FEOL devices of an IC may include complex aspects of an advanced manufacturing process, an advanced untrusted facility may be appropriate for manufacturing the IC through completion of the FEOL. The advanced facility may also be appropriate for manufacturing the IC through completion of, for example, a first, second, or subsequent metal layer, depending on the complexities of these metal layers. After completing manufacturing of the FEOL and any metal layers by the advanced untrusted facility, a trusted facility may be used to complete the remaining layers of the IC to establish the interconnections of the devices, such as logic gates, of the FEOL. Although the remaining description discusses split fabrication after the first metal layer (metal-1), the split fabrication may occur after a metal layer subsequent to the metal-1 layer.

Split fabrication may enable designers to obtain access to advanced semiconductor manufacturing off-shore without revealing system design intent to an untrusted facility. As FEOL and metal-1 may form the most complex and expensive layers in an advanced semiconductor manufacturing process, using an untrusted off-shore facility to manufacture these layers may minimize costs and improve performance. Disclosing only the FEOL and metal-1 layers of the IC may provide unparalleled obfuscation since interconnections between logic gates are typically made above the metal-1 layer in nanoscale semiconductor processes. To make the concept of split fabrication practically feasible in nanoscale processes, and to further improve obfuscation, design regularity is enforced at all levels of abstraction. Thus, split manufacturing of the IC may prevent the system design intent from being revealed to the untrusted facility, may enhance hardware security, and may minimize the likelihood of implanting an attack into the IC at the untrusted facility.

Figure 1:
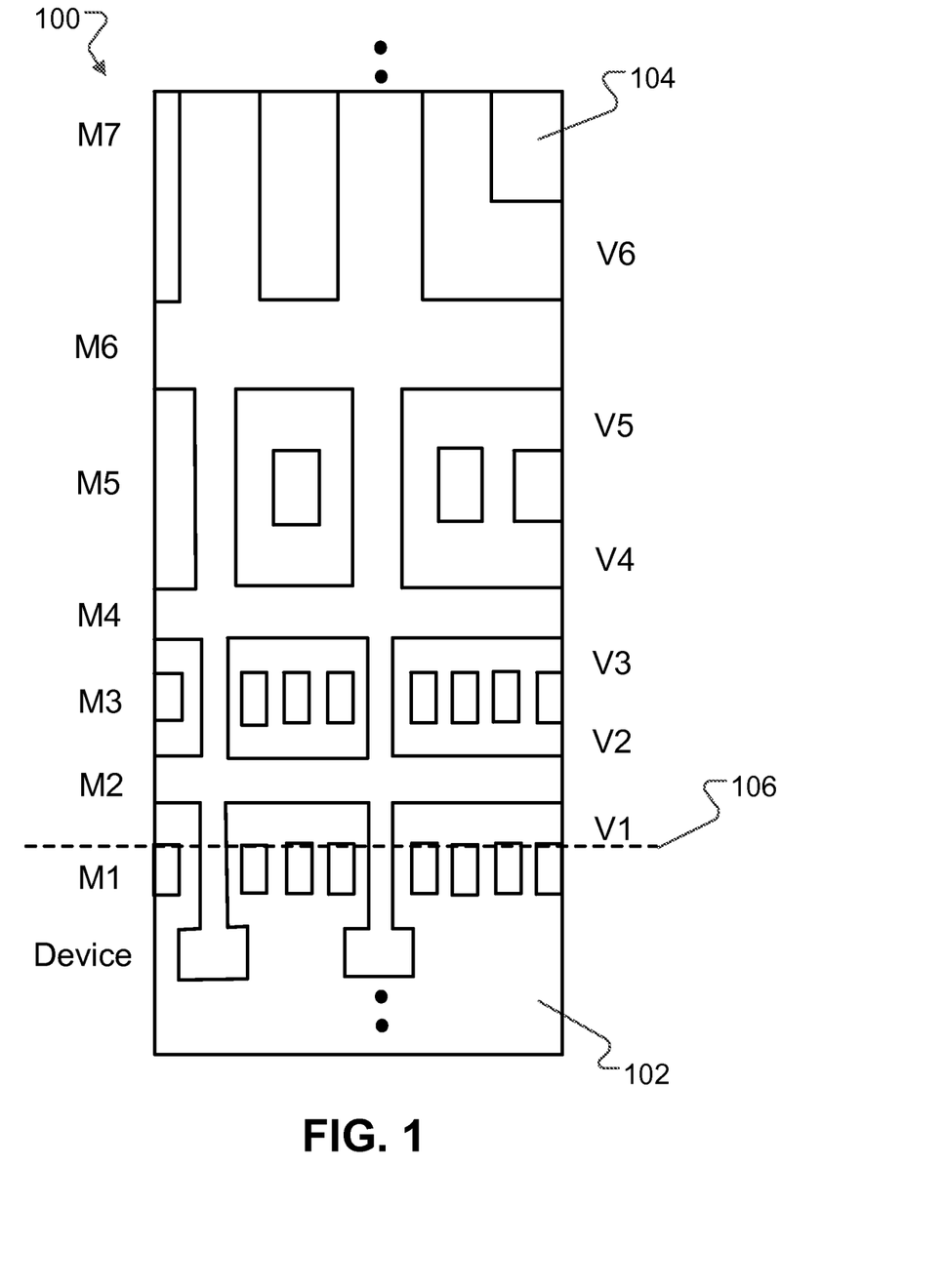
FIG. 1 shows an example of an IC that can be manufactured using split fabrication.

FIG. 1 shows an example of an IC 100 that can be manufactured using split fabrication. The IC includes a FEOL portion 102 and a BEOL portion 104 separated by a dotted line 106 indicating where the split fabrication of the IC 100 occurs. The FEOL portion 102 and the metal M1 layer can be manufactured for the first tier of manufacturing, and then the BEOL portion 104 including layers M2-M7 and V1-V6 can be manufactured for the second tier of manufacturing.

Figure 2:
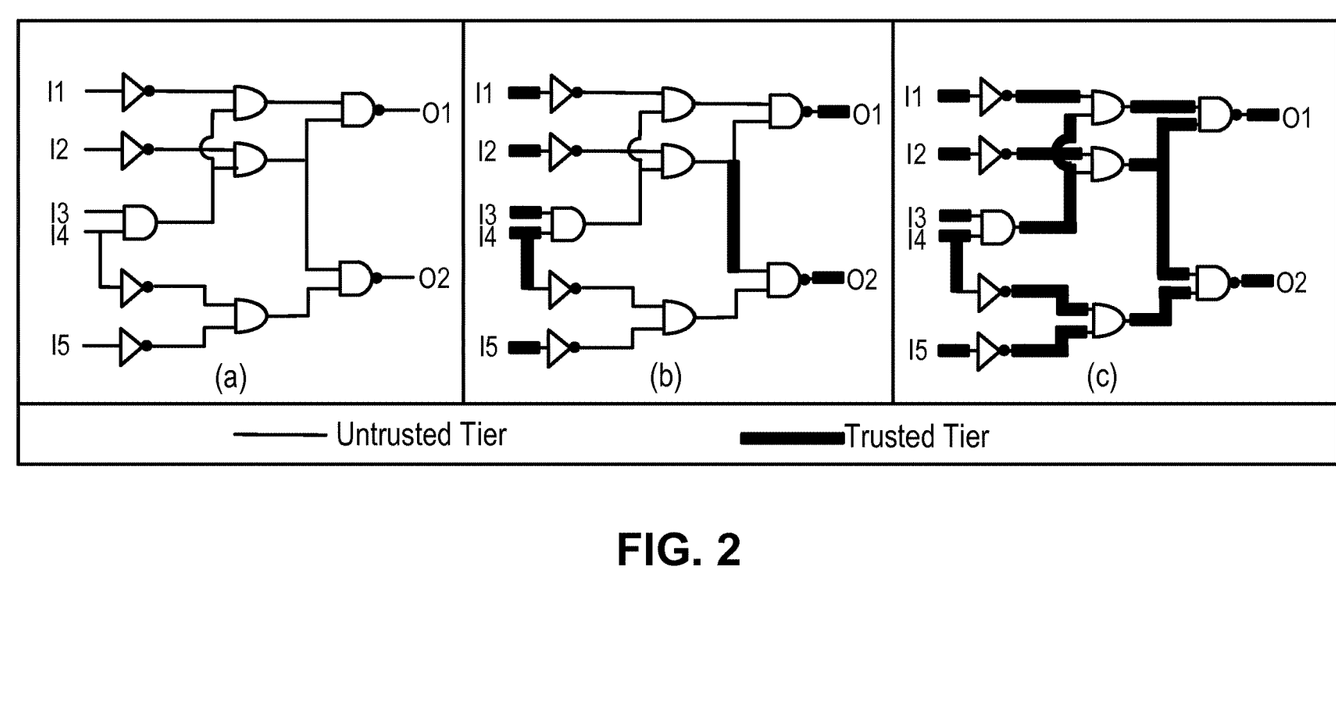
FIG. 2 shows examples of circuit schematics of an IC manufactured (a) without split fabrication, (b) with split fabrication after the third metal (metal-3) layer, and (c) with split fabrication after the first metal (metal-1) layer.

FIG. 2 shows examples of circuit schematics of an IC manufactured (a) without split fabrication, (b) with split fabrication after the third metal (metal-3) layer, and (c) with split fabrication after the first metal (metal-1) layer. As shown in circuit schematic (a) without split manufacturing, the logic gates and all interconnections of the logic gates of the IC are manufactured in a single untrusted tier. An untrusted facility would have access to the complete design of the IC, such as the gate level netlist and the full design layout. If an attacker in an untrusted facility has access to enough design information, the attacker can undertake a variety of attacks on the FEOL portion of the IC. As shown in circuit schematics (b) and (c), implementing split fabrication after the metal-1 layer may provide better circuit obfuscation over implementing split fabrication after the metal-3 layer by hiding all the wires in the design. Circuit obfuscation techniques, such as split fabrication after the metal-1 layer, may work within the framework of an attack model that assumes the untrusted facility does not have access to any information pertaining to the complete design of the IC.

In split fabrication after the metal-1 layer, an attacker in an untrusted facility can implant attacks on the FEOL portion and the metal-1 layer. Examples of attacks that can be implanted include random dopant attacks and reliability attacks. For a random dopant attack, the dopant masks of the FEOL process are modified to impair the function of logic gates and sequential elements. With access to a few aspects of the complete IC design, the attacker may ensure that, for anyone else but the attacker, the circuit would function properly and pass testing of the IC by a BIST. In implanting an attack, the attacker's intent may be to not merely sabotage the chip, but to implant a stealthy attack that will be undetected by modern test and optical inspection techniques. Even if the attacker is not aware of the design intent behind the IC, the attacker may be able to undertake an untargeted attack, where the attacker is unaware of the consequence of the attack and thereby only probabilistically succeed in the attack.

For a reliability attack, an attacker at the untrusted facility maliciously alters process parameters to accelerate aging, causing in-field functional failure, also referred to as denial-of-service. An attacker can design the attack to trigger automatically in a predictable time window to pass functional and structural testing. Because modern manufacturing may allow for regionally localized and targeted FEOL process modifications, the attacker may select a triggering time window by extensively characterizing different manufacturing process parameters and their impact on device aging. IC reliability can be tested using burn-in stress test including elevating temperature and voltage levels to expose infant mortality. An attacker at an untrusted facility may select the time to trigger the attack by ensuring that the implanted attack is not exposed during burn-in. In other words, the attacker may select a time window that is greater than the burn-in time for a successful attack. Armed with the reliability attack and trigger mechanics, the attacker may select which logic gates of the IC to attack by understanding its design and test methodology. If the attacker has access to a few aspects of the complete IC design, a reliability attack can be designed to go undetected by structural testing, functional testing, and optical inspection.

Manufacturing tests, such as at-speed path delay test, can detect manufacturing defects and process variations. At-speed path delay test is typically carried out only for critical paths to detect if a manufacturing induced delay variation in logic gates introduces a path delay fault. Because the number of paths may exponentially increase with the number of logic gates in an IC and not every path in a design is a critical path, testing every single logic gate at-speed using at-speed delay test may be impractical.

Figure 3:
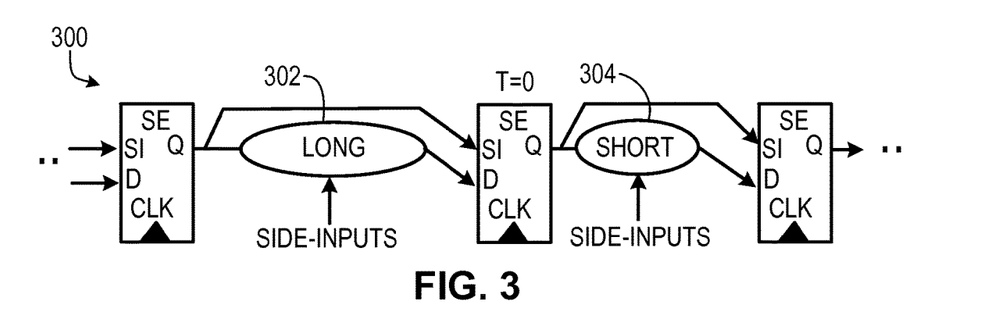
FIG. 3 shows an example of a circuit with logic gates in two paths in the same clock domain.
Figure 4:
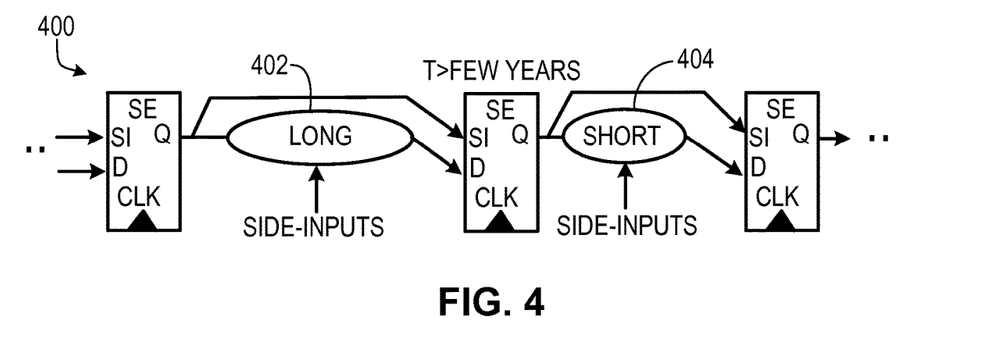
FIG. 4 shows an example of a circuit that results after having been in operation for a few years

FIG. 3 shows an example of a circuit 300 with logic gates in two paths 302 and 304 in the same clock domain. In FIG. 3, the LONG path 302 is a critical path, and the SHORT path 304 is a non-critical path. An attacker at an untrusted facility may implant a reliability attack that accelerates aging in the LONG path 302 or the SHORT path 304. Implanting an attack in the LONG path 302 may be easily detected because at-speed delay test has a maximum likelihood of capturing a path delay fault in a critical path such as LONG path 302. Thus, an astute attacker would implant the accelerated aging attack in the SHORT path 304. The attacker may implant an attack in the SHORT path 304 such that the path delay would degrade with time with accelerated aging. Eventually, the delay of the SHORT path 304 becomes greater than the delay of the critical path, e.g., the LONG path 302. FIG. 4 shows an example of a circuit 400 that results after the circuit 300 has been in operation for a few years. In FIG. 4, the delay of the SHORT path 404 is greater than the delay of the LONG path 302, causing functional failure at a predetermined time window. For such a reliability attack, at-speed path delay testing and reliability stress test may fail to detect this attack in the SHORT path 304, since at time t=0 and at the burn-in time, the SHORT path 304 will not have a delay greater than the critical path. Furthermore, as the aging attack is not a gross delay defect, transition and stuck at fault testing may also fail to detect the attack.

If an attacker at the untrusted facility is unaware of the IC design and is undertaking an untargeted attack, the attacker may not be aware of whether the logic gates targeted in the attack are in the LONG path 302 or the SHORT path 304. Even in such an untargeted attack, with at-speed path delay test, the attacker can succeed by probabilistically attacking a SHORT path. Because many designs may have at least 10% of the logic gates in the SHORT path, the attacker can still succeed with a reasonable probability of 0.1. Therefore, an attacker at an untrusted facility can undertake attacks by manipulating logic gates in a non-critical path. Once the accelerated aging model is characterized, the attacker can trigger a denial-of-service at a desired time for millions of mission critical ICs that are manufactured at the untrusted facility.

Such attacks can be detected using techniques that include exhaustively testing every single logic gate manufactured in the untrusted tier for at-speed function. To test every logic gate for at-speed function, an IC may have to be designed to have two characteristics: a) all gates in the design are in critical paths, and b) the number of paths in the design is proportional (i.e., related by a constant ratio) to the number of gates in the IC as a function of the logic depth. However, such exhaustive testing of the FEOL may be limited by BEOL connections in the design, as an actual design may have logic gates in non-critical paths that cannot be tested for at-speed function using available test techniques. Furthermore, a destructive stress test may be needed to detect a reliability attack.

To work around these limitations, split fabrication can be used to manufacture randomly selected sacrificial dies in a wafer with a design FEOL portion (i.e., a FEOL portion of an IC manufactured according to the actual IC design) and specialized test-only BEOL structure. The specialized test-only BEOL structure can be used to create interconnections of the logic gates in the design FEOL portion so that the resulting IC includes the two characteristics for exhaustively testing the FEOL portion. The test-only BEOL structure can be used to stress test every logic gate for both t=0 (functionality) and t>0 (reliability or aging) failures. Security may be increased by auto-generating a design for the test-only BEOL structure using custom routines only after the untrusted facility ships the design FEOL portion to the trusted facility. The test-only BEOL structures manufactured on sacrificial dies can be used with existing test capabilities and can provide observability and controllability of each logic gate manufactured by an untrusted facility. The specialized test-only BEOL structure may be used to detect attacks implanted anywhere within a design FEOL portion.

Figure 5:
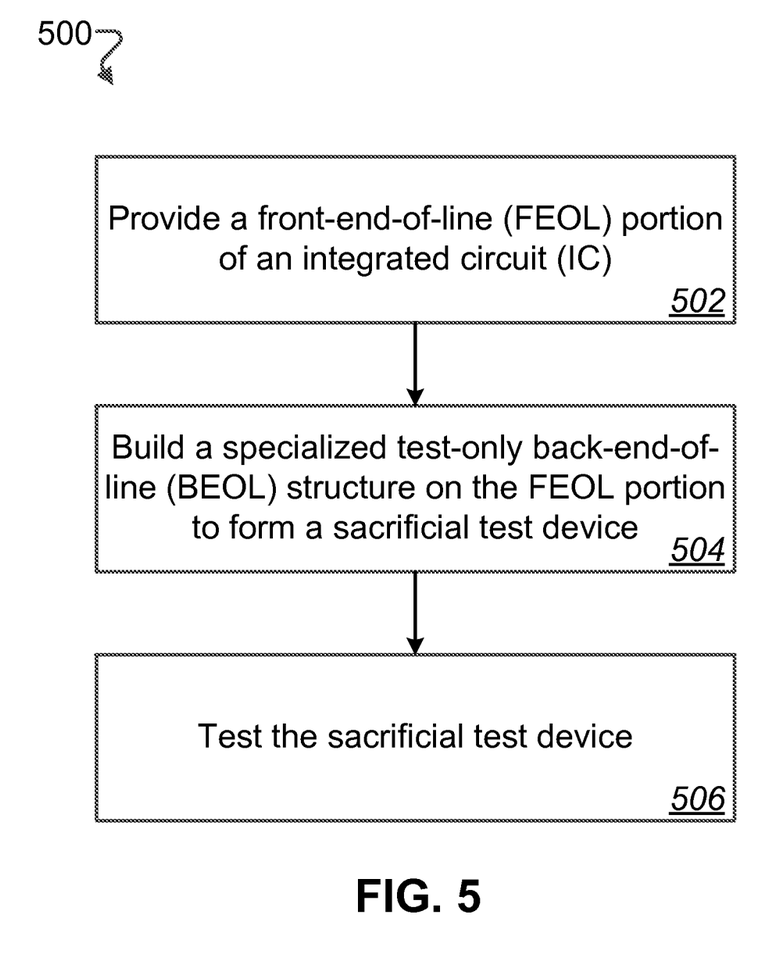
FIG. 5 is a flowchart of operations for testing a design FEOL portion of an IC using a test-only BEOL structure.

FIG. 5 is a flowchart of operations 500 for testing a design FEOL portion of an IC using a specialized test-only BEOL structure. In some implementations, the semiconductor manufacturer performing the operations 500 may be a manufacturer that fabricates both the FEOL portion and the BEOL portion of the IC using split fabrication. In some implementations, the semiconductor manufacturer performing the operations 500 may be a trusted facility that fabricates the BEOL portion of the IC after receiving the FEOL portion of the IC from an untrusted facility.

At 502, a FEOL portion of an IC is provided. The semiconductor manufacturer may fabricate the FEOL portion or may receive the FEOL portion from another facility. The FEOL portion may be fabricated in a wafer having a total set of "y" dies, where each die of the wafer includes an individual, identical FEOL portion of the IC, and each FEOL portion includes logic gates.

At 504, a specialized test-only BEOL structure is built on each FEOL portion of "x" dies selected from the total set of "y" dies in the wafer, such that the number "x" is much less than the number "y" (x<<y). The "x" dies chosen for building the test-only BEOL structure may be randomly selected. These "x" dies with the design FEOL portion and the test-only BEOL structure are sacrificial test devices and can be subjected to rigorous tests to determine the quality of the design FEOL. The manufacturer may build a design BEOL portion (i.e., a BEOL portion of an IC manufactured according to the actual IC design) on each FEOL portion of the remaining "y-x" dies of the wafer. The design BEOL portion configures first design-type interconnections of the logic gates of the FEOL portion for a first instantiation of the IC, and the test-only BEOL structure configures second test-type interconnections of the same logic gates of the FEOL portion for a second instantiation of the IC.

At 506, the sacrificial test device is tested to determine, for example, the characteristics, the behavior, and the quality of the design FEOL portion. During testing, the test-only BEOL structure may provide controllability and observability of every gate of the design FEOL portion. If no unexpected behavior is detected on the "x" dies, all "y-x" design dies may be tested and packaged. Otherwise, all "y" dies may be held for further investigation. The behavior of all the dies on the wafer can be determined by testing the sacrificial "x" dies because of design and process regularity in split fabrication at all levels of abstraction. The ability to configure a test-only BEOL structure in any manner to enable rigorous testing of the FEOL portion may offer a new degree of freedom that may not have been previously available to design and test engineers.

A test-only BEOL design can be created so that one or more of the following objectives are satisfied.

1) The test-only BEOL structure can increase the likelihood of finding an implanted attack that can cause functionality and reliability failures.

2) Any FEOL circuits required to orchestrate the test-only BEOL can be minimized and implemented in an obfuscated manner.

3) For security and productivity reasons, the test-only BEOL design can be generated automatically by a generation tool using custom routines with minimal human intervention. The test-only BEOL design generation recipe can be amenable to work with any random logic block design using a set of control parameters. Different values for the control parameters can create different test-only BEOL structures for the same design FEOL. This may allow the test-only BEOL design to be generated even after the FEOL portion and metal-1 layer are manufactured at an untrusted facility, ensuring that the attacker at the untrusted facility will have no information about the specific test-only BEOL structures used to test the design FEOL portion.

4) The test-only BEOL structure can test as many logic gates as possible for at-speed function and performance.

5) The test-only BEOL structure can allow for efficient manufacturing testing using minimal test resources such as tester time, tester memory, and test vector size.

6) The test-only BEOL design can have sufficient resolution to detect an attack that is beyond process variation but does not manifest as a gross delay defect. It may be assumed that the attacker will not implant an attack that is within manufacturing process variation even after stress test, as such an attack may not be successful since ICs may be designed to operate assuming pessimistic models of process variation.

In some implementations, a test-only BEOL structure may implement a modified at-speed scan scheme for IC designs having logic blocks with scan chains. The test-only BEOL structure is manufactured on a few sacrificial dies to reconfigure logic gate interconnections in the IC design to enable at-speed testability of every single logic gate of the design FEOL portion. The test-only BEOL structure may configure all paths to be critical paths to maximize the likelihood of finding path delay faults in the design FEOL portion, which may maximize the likelihood of detecting an implanted attack. The test-only BEOL structure may configure the paths so that all logic gates are in at least one path that is within 5% of a longest path delay.

Typically, the number of paths in an IC is exponential in relation to the number of gates, which may increase test time and number of test vectors. Further, selecting valid side input values for the logic gates in every path to propagate a transition may be computationally challenging even for medium-sized designs. The test-only BEOL structure for modified at-speed scan may configure the design FEOL portion such that every gate is driven by one time varying input. This may reduce the number of paths and eliminate the challenge of finding side inputs.

Figure 6:
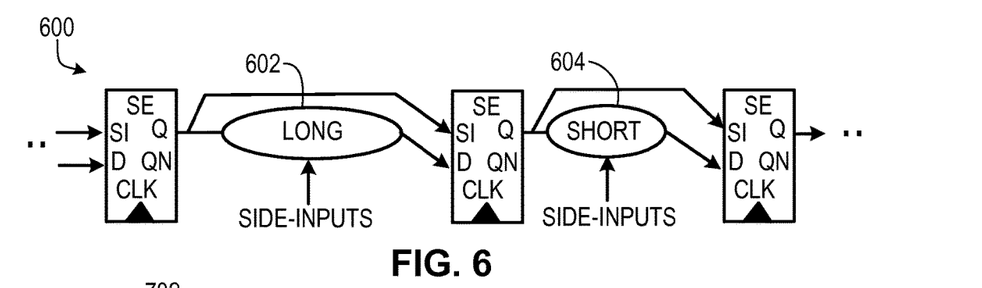
FIG. 6 shows an example of an at-speed scan configuration of an IC.
Figure 7:
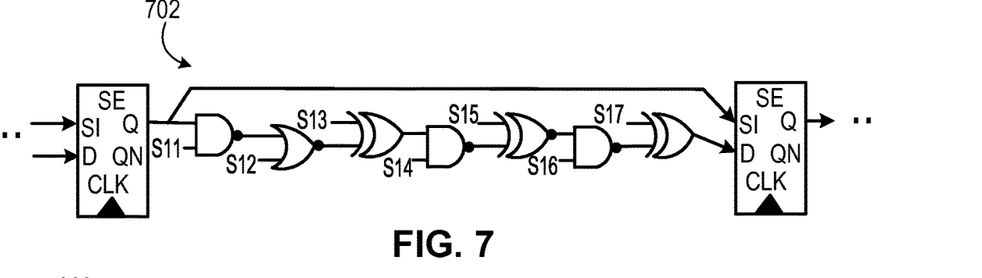
FIG. 7 shows an example of an at-speed scan configuration of logic gates in a critical path of an IC.
Figure 8:
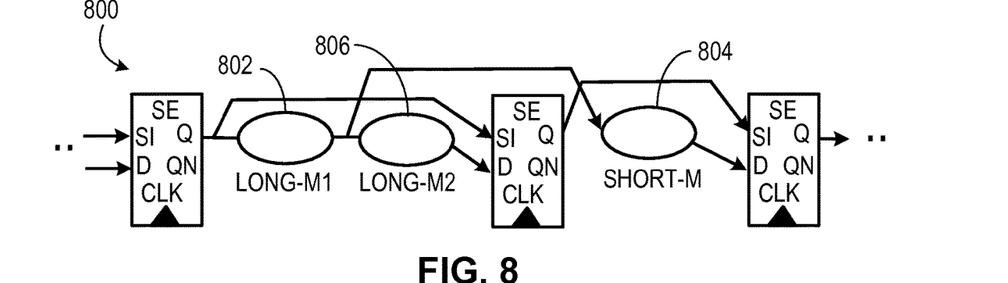
FIG. 8 shows an example of a modified at-speed scan configuration implemented by a test-only BEOL structure.

FIG. 6 shows an example of an at-speed scan configuration 600 of an IC. FIG. 7 shows an example of an at-speed scan configuration of logic gates in a path 702 of an IC. FIG. 8 shows an example of a modified at-speed scan configuration 800 implemented by a test-only BEOL structure. In FIG. 8, the test-only BEOL structure configures every path to be a critical path and side inputs are eliminated. Non-critical paths in the original design, such as SHORT path 604, can be made critical paths by sharing logic gates with other paths. For example, in FIG. 8, SHORT path 604 is configured to be in a critical path that includes LONG-M1 path 802 and SHORT-M path 804.

Figure 9:
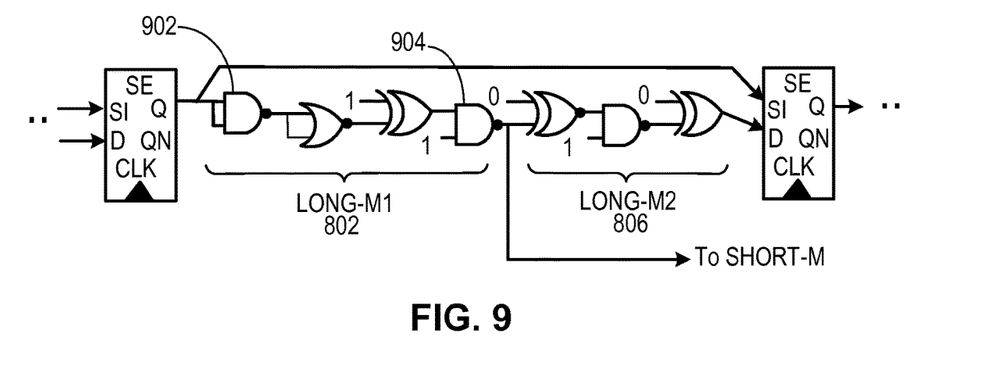
FIG. 9 shows an example of the modified at-speed scan configuration of the logic gates in a critical path implemented by the test-only BEOL structure.

The test-only BEOL structure for modified at-speed scan can randomly configure inputs to a logic gate to detect an attack that manipulates a specific input combination to a logic gate. FIG. 9 shows an example of the modified at-speed scan configuration of the logic gates in LONG-M1 path 802 and LONG-M2 path 806 implemented by the test-only BEOL structure. In FIG. 9, inputs to the NAND gate 902 come from the previous logic gate. For the NAND gate 904, one input comes from the previous logic gate and one input is tied to 1.

Logic blocks in an IC may use BIST instead of scan chains for performance and security reasons. Some attacks on the design FEOL portion of the IC may not be detectable with BIST. The modified at-speed scan scheme described above may also fail to detect attacks in non-scan logic blocks. In some implementations, a test-only BEOL structure may implement a ring oscillator (RO) and divider scheme for IC designs having logic blocks without scan chains.

Figure 10:
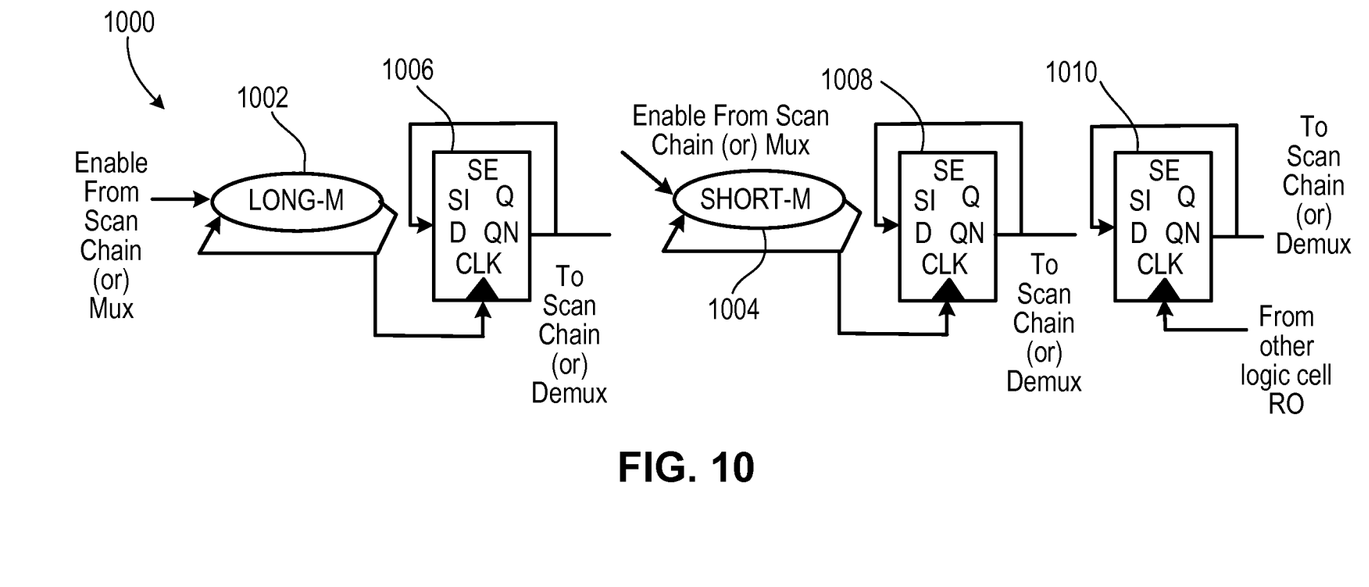
FIG. 10 shows an example of an RO-divider configuration implemented by a test-only BEOL structure.

FIG. 10 shows an example of an RO-divider configuration 1000 implemented by a test-only BEOL structure. In FIG.

10, the test-only BEOL structure configures all logic gates in paths 1002 and 1004 of the design FEOL portion as ring oscillators and configures flip flops 1006, 1008, 1010 of the design FEOL portion as frequency dividers or counters.

The test-only BEOL structure may create different ROs by configuring the connections of the logic gates such that each RO has almost the same delay (e.g., having a difference by at most 5%). The test-only BEOL configures the connections of the logic gates such that each logic gate functions as a buffer or an inverter, and at least one of the gate inputs is driven by another logic gate in the same RO and the remaining inputs, if any, are driven by a fixed 0 or 1. The ROs oscillate with a period that is twice the sum of all gate delays in the RO, propagating alternating transitions, and testing every gate for at-speed function and performance. An attack may be detected by detecting a drift in the RO frequency. Hence, ROs may maximize the likelihood of detecting unexpected behavior in the logic gates forming the RO. The test-only BEOL structure for the RO-divider scheme configures the flip flops or registers of the design FEOL portion to act as dividers. As every flip flop is configured as a divider in this RO-divider scheme, a modification to the dopant mask to implant a stuck at fault in a flip flop would be detected.

Scan chains present in other design blocks may be used to drive the RO's enable inputs and capture the divider outputs. If none of the sub-blocks in an IC have scan chains, demultiplexer (demux) and multiplexer (mux) circuits may be added to the original IC design in an obfuscated manner to provide RO inputs and capture RO outputs. Table 1 summarizes the different attributes of the modified at-speed scan scheme and the RO-divider scheme.

TABLE 1

Comparison between modified at-speed scan and RO-divider implemented by test-only BEOL structures.

| Attribute | Modified At-Speed Scan | RO-Divider |
| --- | --- | --- |
| Likelihood of detecting attack | Maximum | Maximum |
| Additional FEOL circuitry | None | Minimal and Obfuscated |
| Test-only BEOL auto-generation | Possible | Possible |
| Gates tested at-speed | Gates in scan-inserted blocks | All gates in design |
| Test complexity | Low | Low |

A number of implementations have been described. Nevertheless, various modifications can be made without departing from the spirit and scope of the processes and techniques described herein. In addition, the processes depicted in the figures do not require the particular order shown, or sequential order, to achieve desirable results. In addition, other steps can be provided, or steps can be eliminated, from the described processes, and other components can be added to, or removed from, the describe apparatus and systems. Accordingly, other embodiments are within the scope of the following claims.

What is claimed is:

1. A method comprising:
providing at least two identical front-end-of-line (FEOL) portions of an integrated circuit (IC) in a single wafer, with at least some of each FEOL portion comprising a plurality of circuit elements;
building a design back-end-of-line (BEOL) portion of the IC on at least one of the FEOL portions to form a product chip, with the design BEOL portion configuring design type interconnections of the same plurality of circuit elements for a first instantiation;
building a test-only BEOL structure on at least one of the FEOL portions to form a sacrificial test device, with the test-only BEOL structure configuring test-type interconnections of the same plurality of circuit elements for a second instantiation that matches the first instantiation; and
testing the sacrificial test device for at least one of functionality or reliability.

2. The method of claim 1, wherein building the test-only BEOL structure on the FEOL portion comprises building the test-only BEOL structure on the FEOL portion using a split fabrication process.

3. The method of claim 2, further comprising:
after completion of the manufacturing of the FEOL portion of the IC, generating a test-only BEOL design using a set of values for control parameters, where the set of values is selected from a plurality of sets of values for the control parameters, with each of the plurality of sets of values generating a different test-only BEOL design for the FEOL portion,
wherein building the test-only BEOL structure on the FEOL portion comprises building the test-only BEOL structure on a randomly selected sacrificial die of the wafer containing the FEOL portion using the generated test-only BEOL design.

4. The method of claim 1, wherein the plurality of circuit elements comprises a plurality of logic gates, and testing the sacrificial test device comprises testing the sacrificial test device for at-speed function of every logic gate of the plurality of logic gates.

5. The method of claim 4, wherein the test-only BEOL structure configures the test-type interconnections of the same plurality of logic gates so that all of the plurality of logic gates are part of at least one path that is within 5% of a longest path delay of the IC.

6. The method of claim 4, wherein the test-only BEOL structure configures the test-type interconnections of the same plurality of logic gates so that a number of paths is proportional to a number of the plurality of logic gates as a function of the logic depth.

7. The method of claim 4, wherein the test-only BEOL structure configures the test-type interconnections of the same plurality of logic gates so that each of the plurality of logic gates is driven by one time varying input.

8. The method of claim 1, wherein the plurality of circuit elements comprises a plurality of logic gates, and the test-only BEOL structure configures the same plurality of logic gates as one or more ring oscillators (ROs).

9. The method of claim 7, wherein two or more of the ROs have a same delay.

10. The method of claim 1, wherein the plurality of circuit elements comprise a plurality of flip-flops, and the test-only BEOL structure configures the plurality of flip-flops as frequency dividers or counters.

11. A device comprising:
at least two identical front-end-of-line (FEOL) portions of an integrated circuit (IC) in a single wafer, with each of the FEOL portions comprising a plurality of circuit elements;
a design back-end-of-line (BEOL) portion of the IC built on at least one of the FEOL portions to form a product chip, with the design BEOL portion configuring design-type interconnections of the same plurality of circuit elements for a first instantiation; and a test-only BEOL structure built on at least one of the FEOL portions to form a sacrificial test device, with the test-only BEOL structure configuring test-type interconnections of the same plurality of circuit elements for a second instantiation that matches the first instantiation to allow testing of the sacrificial test device for at least one of functionality or reliability.

12. The device of claim 11, wherein the test-only BEOL structure is built on the FEOL portion using a split fabrication process.

13. The method of claim 12, wherein the test-only BEOL structure is built on a randomly selected sacrificial die of the wafer containing the FEOL portion according to a test-only BEOL design, with the test-only BEOL design generated after completion of the manufacturing of the FEOL portion of the IC using a set of values for control parameters, where the set of values is selected from a plurality of sets of values for the control parameters, with each of the plurality of sets of values generating a different test-only BEOL design for the FEOL portion.

14. The method of claim 11, wherein the plurality of circuit elements comprises a plurality of logic gates, and the test-only BEOL structure allows testing of the device for at-speed function of every logic gate of the plurality of logic gates.

15. The method of claim 14, wherein the test-only BEOL structure configures the test-type interconnections of the same plurality of logic gates so that all of the plurality of logic gates are part of at least one path that is within 5% of a longest path delay of the IC.

16. The method of claim 14, wherein the test-only BEOL structure configures the test-type interconnections of the same plurality of logic gates so that a number of paths is proportional to a number of the plurality of logic gates as a function of the logic depth.

17. The method of claim 14, wherein the test-only BEOL structure configures the test-type interconnections of the same plurality of logic gates so that each of the plurality of logic gates is driven by one time varying input.

18. The method of claim 11, wherein the plurality of circuit elements comprises a plurality of logic gates, and the test-only BEOL structure configures the same plurality of logic gates as one or more ring oscillators (ROs).

19. The method of claim 17, wherein two or more of the ROs have a same delay.

20. The method of claim 11, wherein the plurality of circuit elements comprise a plurality of flip-flops, and the test-only BEOL structure configures the plurality of flip-flops as frequency dividers or counters.

* * * * *

UNITED STATES PATENT AND TRADEMARK OFFICE
CERTIFICATE OF CORRECTION

PATENT NO. : 10,393,796 B2
APPLICATION NO. : 15/112369
DATED : August 27, 2019
INVENTOR(S) : Pileggi et al.

Page 1 of 1

It is certified that error appears in the above-identified patent and that said Letters Patent is hereby corrected as shown below:

On the Title Page

Column 2 Item (57), (Abstract), Line 12, delete "interconections" and insert -- interconnections --

In the Specification

Column 1, Line 8, delete "PTC/US2015/012220,filed" and insert -- PCT/US2015/012220, filed --

Signed and Sealed this
Twenty-second Day of October, 2019

Andrei Iancu
*Director of the United States Patent and Trademark Office*